United States Patent
Hong

(10) Patent No.: US 10,672,356 B2
(45) Date of Patent: Jun. 2, 2020

(54) NMOS TYPE GOA CIRCUIT AND DISPLAY PANEL

(71) Applicant: Wuhan China Star Optoelectronics Technology Co., Ltd., Wuhan, Hubei (CN)

(72) Inventor: Guanghui Hong, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 224 days.

(21) Appl. No.: 15/745,109

(22) PCT Filed: Nov. 27, 2017

(86) PCT No.: PCT/CN2017/113107
§ 371 (c)(1),
(2) Date: Jan. 15, 2018

(87) PCT Pub. No.: WO2019/100381
PCT Pub. Date: May 31, 2019

(65) Prior Publication Data
US 2019/0385557 A1    Dec. 19, 2019

(30) Foreign Application Priority Data
Nov. 22, 2017 (CN) .......................... 2017 1 1176115

(51) Int. Cl.
*G09G 3/36* (2006.01)
*G11C 19/28* (2006.01)
(Continued)

(52) U.S. Cl.
CPC ... *G09G 3/3677* (2013.01); *G09G 2310/0202* (2013.01); *G09G 2310/0283* (2013.01);
(Continued)

(58) Field of Classification Search
CPC combination set(s) only.
See application file for complete search history.

(56) References Cited

U.S. PATENT DOCUMENTS

2015/0279266 A1* 10/2015 Onoyama ............ G09G 3/3225
345/206
2017/0221439 A1* 8/2017 Chen .................... G09G 3/3648

FOREIGN PATENT DOCUMENTS

CN    104966500 A    10/2015
CN    105469766 A    4/2016

* cited by examiner

*Primary Examiner* — Deeprose Subedi
(74) *Attorney, Agent, or Firm* — Hemisphere Law, PLLC; Zhigang Ma

(57) ABSTRACT

The present application provides an NMOS type GOA circuit including: M cascaded GOA units, a Nth level GOA unit including: a forward reverse scan control circuit, a node signal control circuit, a node signal output circuit, a pull down circuit, and a output circuit; the forward reverse scan control circuit configured to perform a forward scan or a reverse scan according to a forward scan control signal or a reverse scan control signal; the output circuit including a first thin film transistor and a second thin film transistor, the node signal output circuit including a third thin film transistor, and the pull-down circuit including a fourth thin film transistor; wherein M≥N≥1, the high potential signal is a direct current signal, and the first and the drain terminal of the thin film transistor is one of a source and a drain, and the drain, the third terminal is a gate.

17 Claims, 9 Drawing Sheets

(51) Int. Cl.
*G11C 19/18* (2006.01)
*G11C 19/00* (2006.01)
(52) U.S. Cl.
CPC ............... *G09G 2320/0219* (2013.01); *G09G 2320/0247* (2013.01); *G11C 19/00* (2013.01); *G11C 19/184* (2013.01); *G11C 19/28* (2013.01)

NMOS TYPE GOA CIRCUIT AND DISPLAY PANEL

RELATED APPLICATIONS

The present application is a National Phase of International Application Number PCT/CN2017/113107, filed Nov. 27, 2017, and claims the priority of China Application CN 201711176115.6, filed Nov. 22, 2017.

FIELD OF THE DISCLOSURE

The disclosure relates to a display technical field, and more particularly to a display panel and an NMOS type GOA circuit and a display panel.

BACKGROUND

The Gate Driver on Array, GOA circuit is a circuit for realizing progressive scanning of a display panel. Currently, the driving circuits commonly used in the display panel include a CMOS type GOA circuit and an NMOS type GOA circuit. The CMOS type GOA circuit includes N-channel thin film transistor, NTFT devices and P-channel thin film transistor, PTFT devices; and NMOS-type GOA circuits include only NTFT devices. The GOA control signal line in the NMOS display panel is directly accessed to a first level GOA unit through a WOA trace, and the GOA control signal line needs to go through a large Resistance-Capacitance Circuits, RC circuit, also known as RC filter or RC network and then accessed to a last level GOA unit. In this case, due to the large RC circuit going through, the control signal on the GOA control signal line will be delayed, especially for AC signals such as CK signal (clock signal), so the control signal accessed to the last level GOA unit has a certain degree of delay than accessed to the first level GOA unit, including CK signal, GAS signal (global control signal) and so on. In addition, as shown in FIG. 1, the GOA unit in the conventional NMOS type GOA circuit is shown in FIG. 1, by controlling a potential of Q-point to turn on a thin film transistor NT1, therefore to output a Gate signal (gate control signal) by CK signal, that is, the waveform outputted by the Gate is the CK signal, due to the signal delay mentioned above, delay conditions of the output waveform of the first level GOA unit and the last level GOA unit connected to the first level GOA unit at the same side are inconsistent, that is, the delay degree of the output signal of the first level GOA unit is less, and the delay degree of the output signal of the last level GOA unit is more. As shown in FIG. 2, CK_1 is the waveform of clock signal accessed to the first level GOA unit, and CK_3 is the waveform of clock signal accessed to the next level GOA unit cascaded with the first level GOA unit. It can be seen that the delay is occurred to the clock signal between two GOA units in adjacent cascades; Gate_1 is the waveform of the gate control signal outputted by the first level GOA unit, Gate_M−1 is the waveform of the gate control signal outputted by the last level GOA unit connected to the first level GOA unit, it can be seen that the delay is occurred to the gate control signal outputted by the last level GOA unit.

The occurrence of the condition can cause inconsistencies in the feedthrough voltage across the upper and lower regions of the NMOS display panel, which is the display panel that contains the NMOS-type GOA circuit. As shown in FIG. 3, ΔVa is the feedthrough voltage of the lower region (that is, the region corresponding to the first GOA unit) of an active area AA (the effective display area) of the display panel, ΔVb is the feedthrough voltage of the upper region (that is, the region corresponding to the last level GOA unit connected to the first level GOA unit) of the active area AA of the display panel, it can be seen from FIG. 3, the feedthrough voltages of the upper and lower terminals of the active area AA is significantly inconsistent. The feedthrough voltages of the upper and lower regions of the NMOS display panel are inconsistent to eventually lead to poor flicker uniformity of the upper and lower regions of the NMOS display panel.

SUMMARY

In order to solve the above technical problem, the present application provides an NMOS type GOA circuit and a display panel, which can ensure the consistent feedthrough voltage of the active area AA of the display panel so as to ensure a good flicker uniformity of the NMOS display panel.

The present application provides an NMOS type GOA circuit for using in a liquid crystal display panel, including: M cascaded GOA units, a Nth level GOA unit including: a forward reverse scan control circuit, a node signal control circuit, a node signal output circuit, a pull down circuit, and a output circuit;

The forward reverse scan control circuit configured to control the GOA circuit to perform a forward scan or a reverse scan according to a forward scan control signal or a reverse scan control signal;

The output circuit including a first thin film transistor and a second thin film transistor, the node signal output circuit including a third thin film transistor, and the pull-down circuit including a fourth thin film transistor;

A first terminal of the second thin film transistor accessed to a high voltage signal or connected to a third terminal of the first thin film transistor, a second terminal of the second thin film transistor connected to a first terminal of the first thin film transistor, and a third terminal of the second thin film transistor accessed to a Nth clock signal;

The third terminal of the first thin film transistor connected to an output terminal of the forward reverse scan control circuit and accessed to a low potential signal by a first voltage stabilizing capacitor, a second terminal of the first thin film transistor connected to a first terminal of the fourth thin film transistor and as an output terminal of the Nth gate driving signal, and a second terminal of the fourth thin film transistor accessed to the low potential signal;

The node signal control circuit connected to a third terminal of the third thin film transistor and configured to output a clock signal to the third thin film transistor for controlling the third thin film transistor to be turned on and turned off;

A first terminal of the third thin film transistor connected to a high potential signal, and a second terminal of the third thin film transistor connected to a third terminal of the fourth thin film transistor; and Wherein M≥N≥1, the high potential signal is a direct current signal, and the first terminal of the thin film transistor is one of a source and a drain, the second terminal is the other of the source and the drain, the third terminal is a gate.

Preferredly, the forward and reverse scan control circuit includes a fifth thin film transistor and a sixth thin film transistor, the GOA unit further includes a seventh thin film transistor;

A first terminal and a third terminal of the fifth thin film transistor are respectively accessed to the forward scanning control signal and a N−2th gate driving signal, and a second terminal is connected to a first terminal of the seventh thin film transistor;

A third terminal of the seventh thin film transistor is connected to the high potential signal, a second terminal of the seventh thin film transistor is connected to the third terminal of the first thin film transistor; and A first terminal and a third terminal of the sixth thin film transistor are respectively accessed to the reverse scan control signal and a N+2th gate driving signal, and a second terminal is connected to the second terminal of the fifth thin film transistor.

Preferredly, the GOA unit further includes a pull-up circuit;

The pull-up circuit includes an eighth thin film transistor and a ninth thin film transistor, the pull-down circuit further includes a tenth thin film transistor;

A first terminal of the eighth thin film transistor is connected to the third terminal of the fourth thin film transistor, a second terminal and a third terminal of the eighth thin film transistor are respectively accessed to the low potential signal and a first global control signal;

A first terminal and a third terminal of the ninth thin film transistor are both accessed to a first global control signal, and a second terminal is connected to the second terminal of the first thin film transistor; and A first terminal of the tenth thin film transistor is connected to the second terminal of the first thin film transistor, a second terminal and a third terminal of the tenth thin film transistor are respectively accessed to the low potential signal and a second global control signal.

Preferredly, the node signal control circuit includes an eleventh thin film transistor and a twelfth thin film transistor;

A first terminal of the eleventh thin film transistor and a first terminal of the twelfth thin film transistor are respectively accessed to a N+1th clock signal and a N−1th clock signal, a second terminal of the eleventh thin film transistor is connected to a second terminal of the twelfth thin film transistor and the third terminal of the third thin film transistor, a third terminal of the eleventh thin film transistor and a third terminal of the twelfth thin film transistor are accessed to the forward scan control signal and the reverse scan control signal, respectively.

Preferredly, the GOA unit further includes a reset circuit, the reset circuit includes a thirteenth thin film transistor, a first terminal of the thirteenth thin film transistor is connected to the third terminal of the fourth thin film transistor, a second terminal of the thirteenth thin film transistor is connected to a third terminal of the thirteenth thin film transistor and is accessed to the reset signal.

Preferredly, the GOA unit further includes a fourteenth thin film transistor and a fifteenth thin film transistor;

A first terminal and a third terminal of the fourteenth thin film transistor are respectively connected to the first terminal of the seventh thin film transistor and the second terminal of the third thin film transistor, a second terminal of the fourteenth thin film transistor is accessed to the low potential signal;

A first terminal and a third terminal of the fifteenth thin film transistor are respectively connected to the third terminal of the fourth thin film transistor and the second terminal of the sixth thin film transistor, a second terminal of the fifteenth thin film transistor is accessed to the low potential signal.

Preferredly, the GOA unit further includes a second voltage stabilizing capacitor;

Two terminals of the second voltage stabilizing capacitor are respectively connected to the first terminal and the second terminal of the eighth thin film transistor.

Preferredly, RC circuits are connected in series between adjacent odd-numbered level GOA units and adjacent even-numbered level GOA units.

Preferredly, a source of the second thin film transistor is accessed to the high potential signal, and a drain of the second thin film transistor is connected to a source of the first thin film transistor.

The present application further includes an NMOS type GOA circuit for using in a liquid crystal display panel, including: M cascaded GOA units, a Nth level GOA unit including: a forward reverse scan control circuit, a node signal control circuit, a node signal output circuit, a pull down circuit, and a output circuit;

The forward reverse scan control circuit configured to control the GOA circuit to perform a forward scan or a reverse scan according to a forward scan control signal or a reverse scan control signal;

The output circuit including a first thin film transistor and a second thin film transistor, the node signal output circuit including a third thin film transistor, and the pull-down circuit including a fourth thin film transistor;

A first terminal of the second thin film transistor accessed to a high voltage signal or connected to a third terminal of the first thin film transistor, a second terminal of the second thin film transistor connected to a first terminal of the first thin film transistor, and a third terminal of the second thin film transistor accessed to a Nth clock signal;

The third terminal of the first thin film transistor connected to an output terminal of the forward reverse scan control circuit and accessed to a low potential signal by a first voltage stabilizing capacitor, a second terminal of the first thin film transistor connected to a first terminal of the fourth thin film transistor and as an output terminal of the Nth gate driving signal, and a second terminal of the fourth thin film transistor accessed to the low potential signal;

The node signal control circuit connected to a third terminal of the third thin film transistor and configured to output a clock signal to the third thin film transistor for controlling the third thin film transistor to be turned on and turned off;

A first terminal of the third thin film transistor connected to a high potential signal, and a second terminal of the third thin film transistor connected to a third terminal of the fourth thin film transistor;

Wherein the forward and reverse scan control circuit includes a fifth thin film transistor and a sixth thin film transistor, the GOA unit further includes a seventh thin film transistor;

A first terminal and a third terminal of the fifth thin film transistor are respectively accessed to the forward scanning control signal and a N−2th gate driving signal, and a second terminal is connected to a first terminal of the seventh thin film transistor;

A third terminal of the seventh thin film transistor is connected to the high potential signal, a second terminal of the seventh thin film transistor is connected to the third terminal of the first thin film transistor; and A first terminal and a third terminal of the sixth thin film transistor are respectively accessed to the reverse scan control signal and a N+2th gate driving signal, and a second terminal is connected to the second terminal of the fifth thin film transistor;

Wherein M≥N≥1, the high potential signal is a direct current signal, and the first terminal of the thin film transistor is one of a source and a drain, the second terminal is the other of the source and the drain, the third terminal is a gate.

Preferredly, the GOA unit further includes a pull-up circuit;

The pull-up circuit includes an eighth thin film transistor and a ninth thin film transistor, the pull-down circuit further includes a tenth thin film transistor;

A first terminal of the eighth thin film transistor is connected to the third terminal of the fourth thin film transistor, a second terminal and a third terminal of the eighth thin film transistor are respectively accessed to the low potential signal and a first global control signal;

A first terminal and a third terminal of the ninth thin film transistor are both accessed to a first global control signal, and a second terminal is connected to the second terminal of the first thin film transistor; and A first terminal of the tenth thin film transistor is connected to the second terminal of the first thin film transistor, a second terminal and a third terminal of the tenth thin film transistor are respectively accessed to the low potential signal and a second global control signal.

Preferredly, the node signal control circuit includes an eleventh thin film transistor and a twelfth thin film transistor;

A first terminal of the eleventh thin film transistor and a first terminal of the twelfth thin film transistor are respectively accessed to a N+1th clock signal and a N−1th clock signal, a second terminal of the eleventh thin film transistor is connected to a second terminal of the twelfth thin film transistor and the third terminal of the third thin film transistor, a third terminal of the eleventh thin film transistor and a third terminal of the twelfth thin film transistor are accessed to the forward scan control signal and the reverse scan control signal, respectively.

Preferredly, the GOA unit further includes a reset circuit, the reset circuit includes a thirteenth thin film transistor, a first terminal of the thirteenth thin film transistor is connected to the third terminal of the fourth thin film transistor, a second terminal of the thirteenth thin film transistor is connected to a third terminal of the thirteenth thin film transistor and is accessed to the reset signal.

Preferredly, the GOA unit further includes a fourteenth thin film transistor and a fifteenth thin film transistor;

A first terminal and a third terminal of the fourteenth thin film transistor are respectively connected to the first terminal of the seventh thin film transistor and the second terminal of the third thin film transistor, a second terminal of the fourteenth thin film transistor is accessed to the low potential signal;

A first terminal and a third terminal of the fifteenth thin film transistor are respectively connected to the third terminal of the fourth thin film transistor and the second terminal of the sixth thin film transistor, a second terminal of the fifteenth thin film transistor is accessed to the low potential signal.

Preferredly, the GOA unit further includes a second voltage stabilizing capacitor;

Two terminals of the second voltage stabilizing capacitor are respectively connected to the first terminal and the second terminal of the eighth thin film transistor.

Preferredly, RC circuits are connected in series between adjacent odd-numbered level GOA units and adjacent even-numbered level GOA units.

Preferredly, a source of the second thin film transistor is accessed to the high potential signal, and a drain of the second thin film transistor is connected to a source of the first thin film transistor.

The present application further includes a display panel, including an NMOS type GOA circuit for using in a liquid crystal display panel, including: M cascaded GOA units, a Nth level GOA unit including: a forward reverse scan control circuit, a node signal control circuit, a node signal output circuit, a pull down circuit, and a output circuit;

The forward reverse scan control circuit configured to control the GOA circuit to perform a forward scan or a reverse scan according to a forward scan control signal or a reverse scan control signal;

The output circuit including a first thin film transistor and a second thin film transistor, the node signal output circuit including a third thin film transistor, and the pull-down circuit including a fourth thin film transistor;

A first terminal of the second thin film transistor accessed to a high voltage signal or connected to a third terminal of the first thin film transistor, a second terminal of the second thin film transistor connected to a first terminal of the first thin film transistor, and a third terminal of the second thin film transistor accessed to a Nth clock signal;

The third terminal of the first thin film transistor connected to an output terminal of the forward reverse scan control circuit and accessed to a low potential signal by a first voltage stabilizing capacitor, a second terminal of the first thin film transistor connected to a first terminal of the fourth thin film transistor and as an output terminal of the Nth gate driving signal, and a second terminal of the fourth thin film transistor accessed to the low potential signal;

The node signal control circuit connected to a third terminal of the third thin film transistor and configured to output a clock signal to the third thin film transistor for controlling the third thin film transistor to be turned on and turned off;

A first terminal of the third thin film transistor connected to a high potential signal, and a second terminal of the third thin film transistor connected to a third terminal of the fourth thin film transistor; and Wherein M≥N≥1, the high potential signal is a direct current signal, and the first terminal of the thin film transistor is one of a source and a drain, the second terminal is the other of the source and the drain, the third terminal is a gate.

Preferredly, the forward and reverse scan control circuit includes a fifth thin film transistor and a sixth thin film transistor, the GOA unit further includes a seventh thin film transistor;

A first terminal and a third terminal of the fifth thin film transistor are respectively accessed to the forward scanning control signal and a N−2th gate driving signal, and a second terminal is connected to a first terminal of the seventh thin film transistor;

A third terminal of the seventh thin film transistor is connected to the high potential signal, a second terminal of the seventh thin film transistor is connected to the third terminal of the first thin film transistor;

A first terminal and a third terminal of the sixth thin film transistor are respectively accessed to the reverse scan control signal and a N+2th gate driving signal, and a second terminal is connected to the second terminal of the fifth thin film transistor.

Preferredly, the GOA unit further includes a pull-up circuit;

The pull-up circuit includes an eighth thin film transistor and a ninth thin film transistor, the pull-down circuit further includes a tenth thin film transistor;

A first terminal of the eighth thin film transistor is connected to the third terminal of the fourth thin film transistor, a second terminal and a third terminal of the eighth thin film transistor are respectively accessed to the low potential signal and a first global control signal;

A first terminal and a third terminal of the ninth thin film transistor are both accessed to a first global control signal, and a second terminal is connected to the second terminal of the first thin film transistor; and A first terminal of the tenth thin film transistor is connected to the second terminal of the first thin film transistor, a second terminal and a third terminal of the tenth thin film transistor are respectively accessed to the low potential signal and a second global control signal.

The implementation of the present application has the following beneficial effects: by adding the second thin film transistor controlled by the Nth clock signals to turn on the first thin film transistor by the Q point potential, when the first thin film transistor and the second thin film transistor are turned on, the high potential signal outputting the Nth gate driving signal. Relative to the Nth clock signal, the high potential signal is a DC signal, the high potential signal through the RC circuit between adjacent cascaded GOA units, the delay is less, so as to ensure the delay condition of the gate driving signals outputted by upper and lower regions of the NMOS display panel is substantially the same. Alternatively, the first thin film transistor may be turned on by the Q point potential, and the Nth gate driving signal may be outputted by the Q point signal. Compared with the CK signal, the Q point signal is the signal directly generated by each level of GOA unit, and the Q point is also connected with the first voltage stabilizing capacitor. Therefore, the Q point potential is a relatively stable potential during the operation of each level GOA unit, basically no delay occurs, so as to ensure that the delay status of the gate driving signals outputted by the upper and lower regions of the NMOS display panel is consistent. Thereby ensuring the consistent feedthrough voltages of the active area AA of the display panel, and ensuring the good flickering uniformity of the NMOS display panel.

BRIEF DESCRIPTION OF THE DRAWINGS

To describe the technical solutions in the embodiments of the present application or in the prior art more clearly, the following briefly introduces the accompanying drawings required for describing the embodiments or the prior art. Apparently, the accompanying drawings in the following description merely show some embodiments of the present application. For those skilled in the art, other drawings may be obtained based on these drawings without any creative work.

DETAILED DESCRIPTION OF PREFERRED EMBODIMENTS

Figure 4:
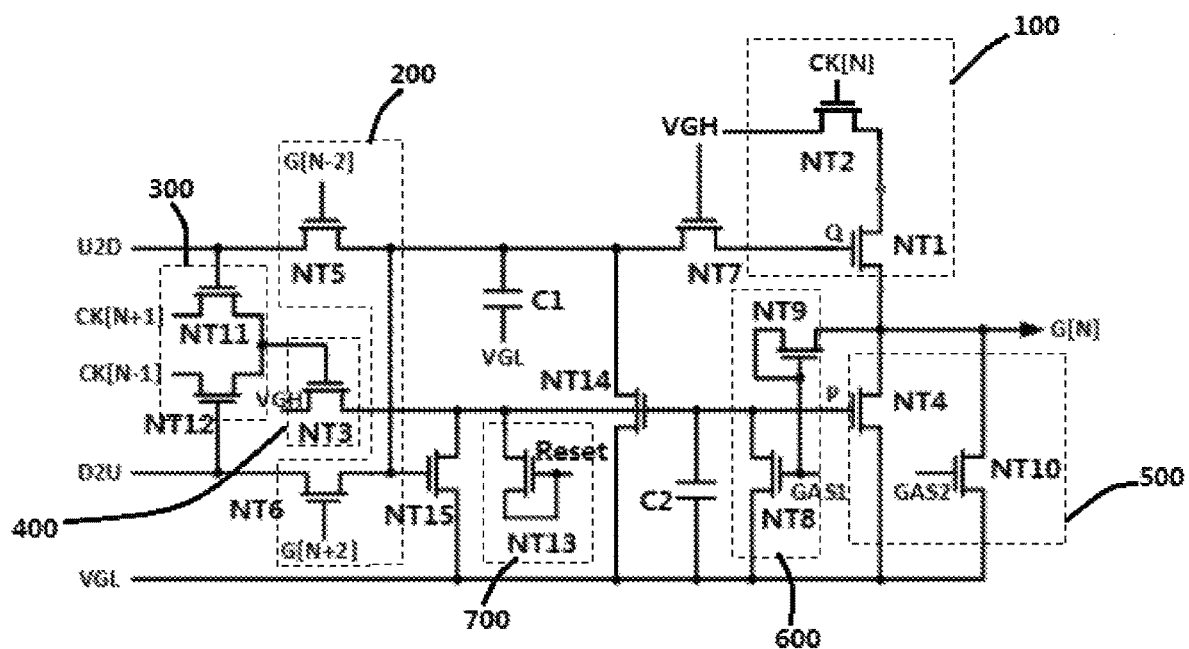
FIG. 4 is a circuit diagram of the GOA unit according to a first embodiment provided by the present application.

The present application provides an NMOS type GOA circuit for using in a liquid crystal display panel. As shown in FIG. 4, in the first embodiment, the NMOS type GOA circuit includes M cascaded GOA units. The Nth level GOA unit includes: a forward reverse scan control circuit 200, a node signal control circuit 300, a node signal output circuit 400, a pull down circuit 500, and a output circuit 100.

The forward reverse scan control circuit 200 is configured to control the GOA circuit to perform forward scan or reverse scan according to a forward scan control signal U2D or a reverse scan control signal D2U.

The output circuit 100 includes a first thin film transistor NT1 and a second thin film transistor NT2, the node signal output circuit 400 includes a third thin film transistor NT3, and the pull-down circuit 500 includes a fourth thin film transistor NT4.

A first terminal of the second thin film transistor NT2 is accessed to a high voltage signal VGH, a second terminal of the second thin film transistor NT2 is connected to a first terminal of the first thin film transistor NT1, and a third terminal of the second thin film transistor NT2 is accessed to a Nth clock signal CK[N].

A third terminal of the first thin film transistor NT1 is connected to an output terminal of the forward reverse scan control circuit 200 and accessed to a low potential signal VGL by a first voltage stabilizing capacitor C1, and a second terminal of the first thin film transistor NT1 is connected to a first terminal of the fourth thin film transistor NT4, and as an output terminal of the Nth gate driving signal G[N], and a second terminal of the fourth thin film transistor NT4 is accessed to the low potential signal VGL.

The node signal control circuit 300 is connected to a third terminal of the third thin film transistor NT3, is configured to output a clock signal to the third thin film transistor NT3, and control the third thin film transistor NT3 to be turned on and turned off.

A first terminal of the third thin film transistor NT3 is connected to a high potential signal VGH, and a second terminal of the third thin film transistor NT3 is connected to a third terminal of the fourth thin film transistor NT4.

Wherein M≥N≥1, the high potential signal VGH is a direct current signal, and the first terminal of the thin film transistor is one of a source and a drain, the second terminal is the other of the source and the drain, the third terminal is a gate. Preferably, the low potential signal VGL is also a direct current signal. All of the thin film transistors in the NMOS type GOA circuit are N-channel thin film transistors.

Figure 3:
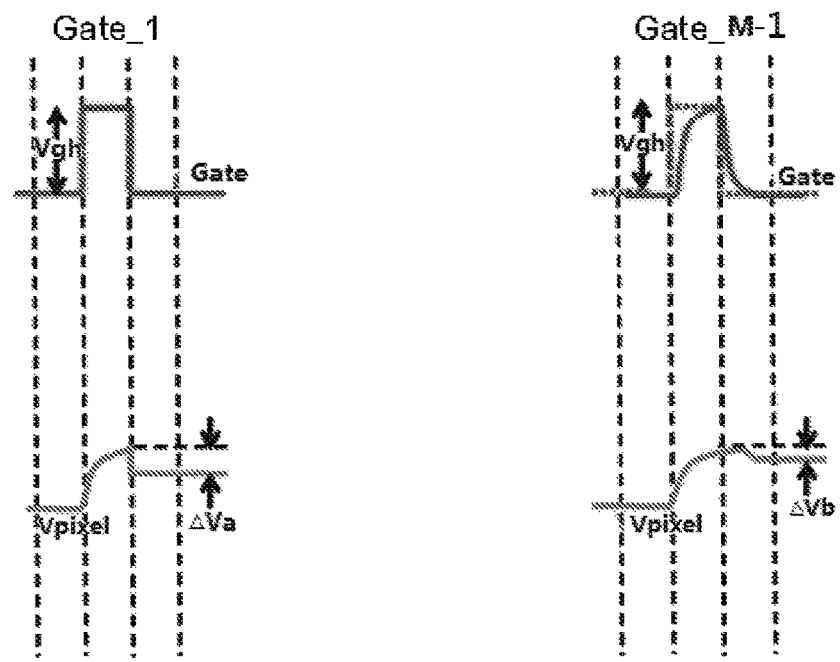
FIG. 3 is a schematic diagram of the feedthrough voltages of the upper and lower regions of the active area AA in the display panel based on the NMOS type GOA circuit provided by the present application.

A Q point in FIG. 3 or FIG. 4 is connected to the third terminal of the first thin film transistor NT1, a point P is connected to the third terminal of the fourth thin film transistor NT4.

Figure 5:
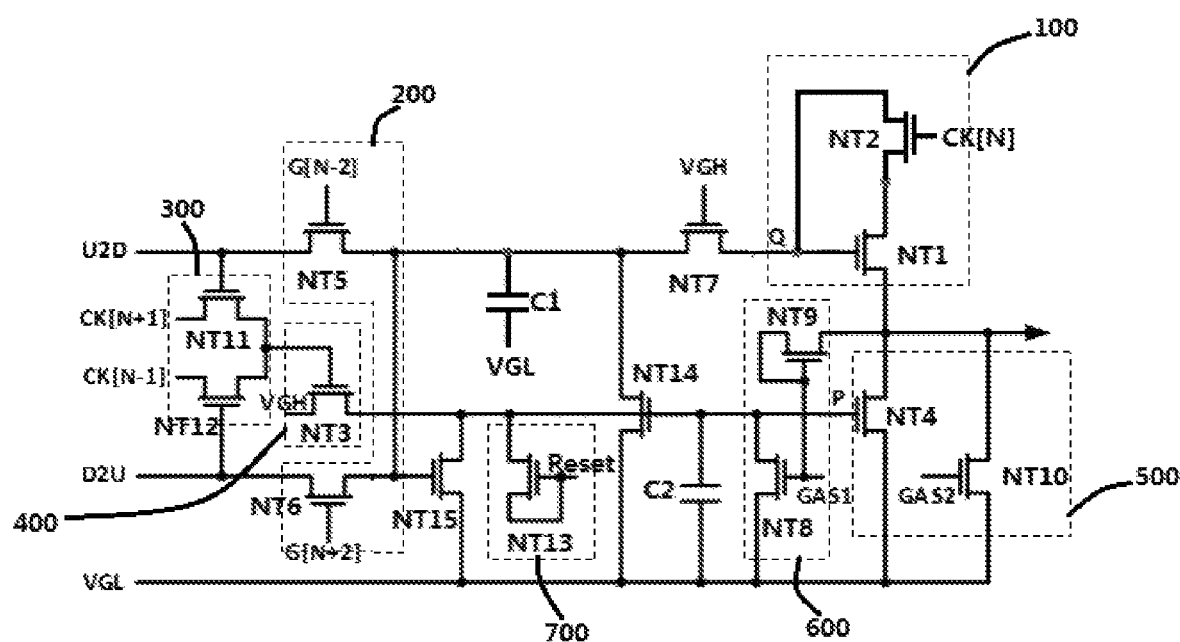
FIG. 5 is a circuit diagram of the GOA unit according to a second embodiment of the present application.

As shown in FIG. 5, in the second embodiment, the first terminal of the second thin film transistor NT2 is connected to the third terminal of the first thin film transistor NT1.

Figure 6:
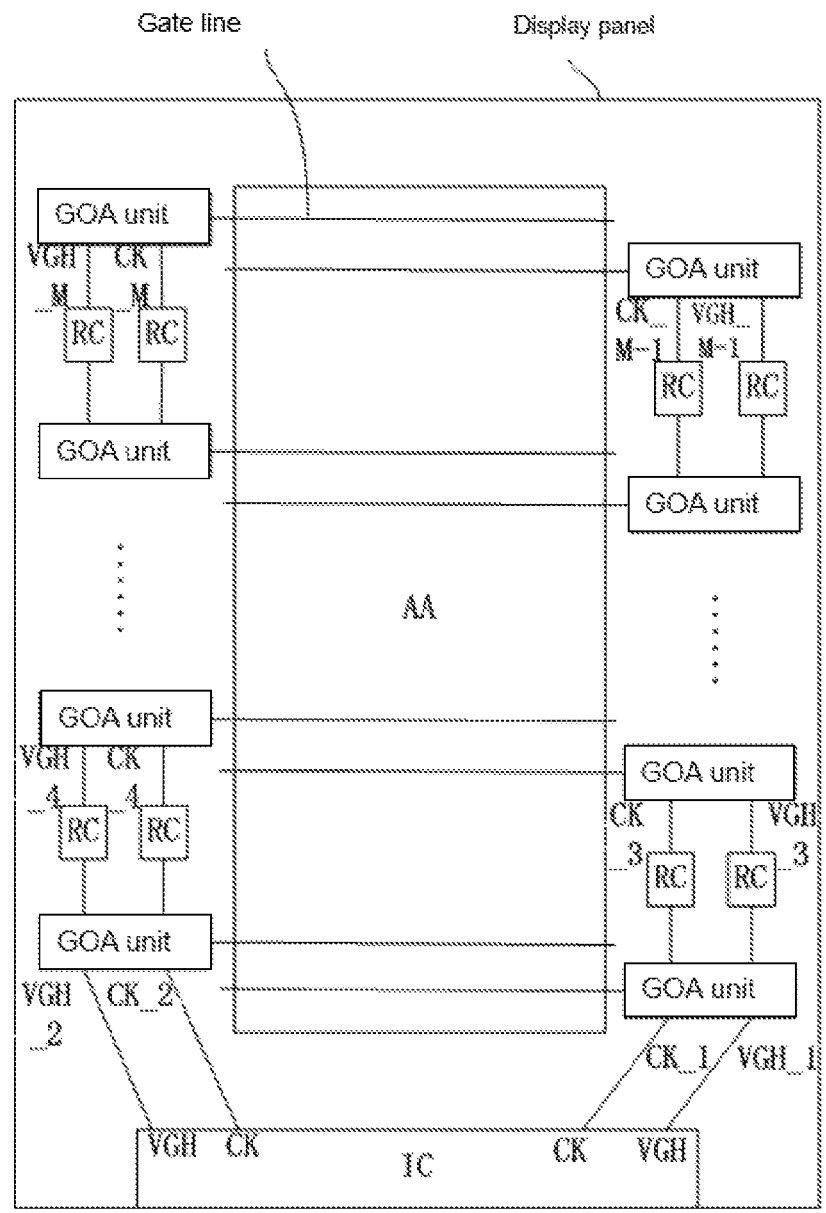
FIG. 6 is a schematic diagram of the arrangement of the NMOS type GOA circuit in the display panel provided in the present application.

Further, as shown in FIG. 6, RC circuits are connected in series between adjacent odd-numbered level GOA units and adjacent even-numbered level GOA units. For example, the number M of GOA units in the NMOS-type GOA circuit is generally even, a left side in FIG. 6 shows the even-numbered level GOA units (from the left side of an integrated circuit in FIG. 6 is the second level GOA unit, the fourth level GOA unit, . . . the M level GOA unit, etc. from bottom to top), a right side in FIG. 6 shows the odd-numbered level GOA units (from the right side of the integrated circuit in FIG. 6 is the first level GOA unit, the third level GOA unit, . . . the M−1 level GOA unit, etc. from bottom to top), wherein the odd-numbered level GOA units are cascaded with each other and even-numbered level GOA units are cascaded with each other. It can also be seen from FIG. 6 that the clock signal CK and the high potential signal VGH are output to the first level GOA unit and the second level GOA unit by the integrated circuit, IC.

Further, the forward and reverse scan control circuit 200 includes a fifth thin film transistor NT5 and a sixth thin film transistor NT6, the GOA unit further includes a seventh thin film transistor NT7.

A first terminal and a third terminal of the fifth thin film transistor NT5 are respectively accessed to the forward scanning control signal U2D and the N−2th gate driving signal G[N−2], and a second terminal is connected to a first terminal of the seventh thin film transistor NT7.

A third terminal of the seventh thin film transistor NT7 is accessed to the high potential signal VGH, a second terminal of the seventh thin film transistor NT7 is connected to the third terminal of the first thin film transistor NT1.

A first terminal and a third terminal of the sixth thin film transistor NT6 are respectively accessed to the reverse scan control signal D2U and the N+2th gate driving signal G[N+2], and a second terminal is connected to the second terminal of the fifth thin film transistor NT5.

Further, the GOA unit further includes a pull-up circuit 600. The pull-up circuit 600 includes an eighth thin film transistor NT8 arid a ninth thin film transistor NT9. The pull-down circuit 500 further includes a tenth thin film transistor NT10.

A first terminal of the eighth thin film transistor NT8 is connected to the third terminal of the fourth thin film transistor NT4, a second terminal and a third terminal of the eighth thin film transistor NT8 are respectively accessed to the low potential signal VGL and a first global control signal GAS1.

A first terminal and a third terminal of the ninth thin film transistor NT9 are both accessed to the first global control signal GAS1, and a second terminal is connected to the second terminal of the first thin film transistor NT1.

A first terminal of the tenth thin film transistor NT10 is connected to the second terminal of the first thin film transistor NT1, a second terminal and a third terminal of the tenth thin film transistor NT10 are respectively accessed to the low potential signal VGL and a second global control signal GAS2.

Further, the node signal control circuit 300 includes an eleventh thin film transistor NT11 and a twelfth thin film transistor NT12.

A first terminal of the eleventh thin film transistor NT11 and a first terminal of the twelfth thin film transistor NT12 are respectively accessed to the N+1th clock signal CK[N+1] and the N−1th clock signal CK[N−1], a second terminal of the eleventh thin film transistor NT11 is connected to a second terminal of the twelfth thin film transistor NT12 and the third terminal of the third thin film transistor NT3, a third terminal of the eleventh thin film transistor NT11 and a third terminal of the twelfth thin film transistor NT12 are accessed to the forward scan control signal U2D and the reverse scan control signal D2U, respectively.

Preferably, there are four clock signals in the NMOS type GOA circuit: a first clock signal CK[1], a second clock signal CK[2], a third clock signal CK[3], a fourth clock signal CK[4]. When the Nth clock signal CK[N] is the first clock signal CK[1], the N−1th clock signal CK[N−1] is the fourth clock signal CK[4], the N+1 clock signal CK[N+11] is the second clock signal CK[2]. When the Nth clock signal CK[N] is the fourth clock signal CK[4], the N−1th clock signal is the third clock signal CK[3], the N+1th clock signal CK[N+11] is the first clock signal CK[1].

Further, the GOA unit further includes a reset circuit 700. The reset circuit 700 includes a thirteenth thin film transistor NT13. A first terminal of the thirteenth thin film transistor NT13 is connected to a third terminal of the fourth thin film transistor NT4, a second terminal of the thirteenth thin film transistor NT13 is connected to a third terminal of the thirteenth thin film transistor NT13 and is accessed to the reset signal Reset.

Further, the GOA unit further includes a fourteenth thin film transistor NT14 and a fifteenth thin film transistor NT15.

A first terminal and a third terminal of the fourteenth thin film transistor NT14 are respectively connected to the first terminal of the seventh thin film transistor NT7 and the second terminal of the third thin film transistor NT3, a second terminal of the fourteenth thin film transistor NT14 is accessed to the low potential signal VGL.

A first terminal and a third terminal of the fifteenth thin film transistor NT15 are respectively connected to the third terminal of the fourth thin film transistor NT4 and the second terminal of the sixth thin film transistor NT6, a second terminal of the fifteenth thin film transistor NT15 is accessed to the low potential signal VGL.

Further, the GOA unit further includes a second voltage stabilizing capacitor C2.

Figure 7:
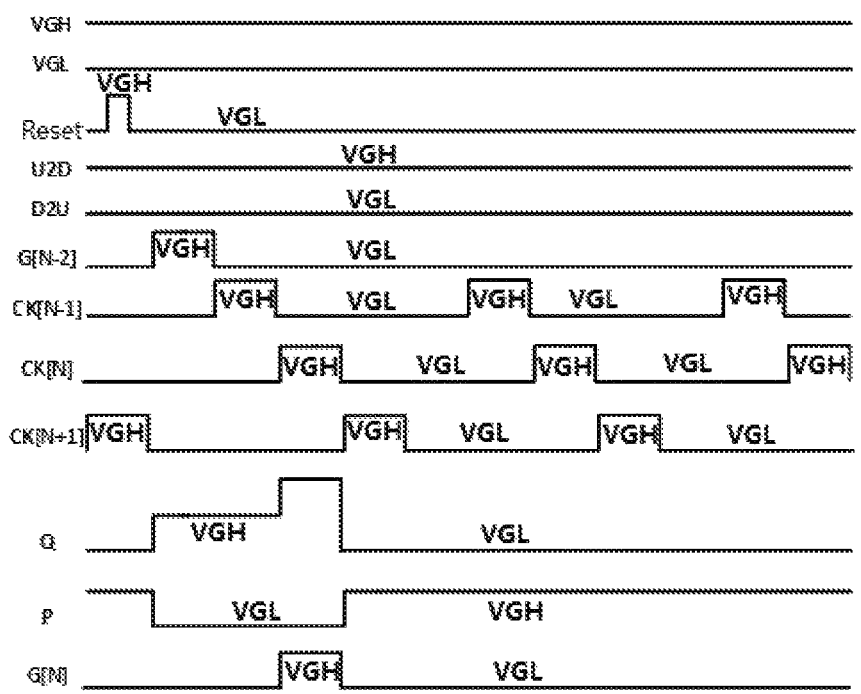
FIG. 7 is a unipolar operating timing diagram of the NMOS type GOA circuit provided in the present application.

Two terminals of the second voltage stabilizing capacitor C2 are respectively connected to the first terminal and the second terminal of the eighth thin film transistor NT8. As shown in FIG. 7, FIG. 7 shows a timing diagram of each signal in the NMOS type GOA circuit. The waveform diagram corresponding to Q in FIG. 7 is the waveform diagram of the Q point signal in the GOA unit, the waveform diagram corresponding to P is the waveform diagram of the P point signal in the GOA unit.

Further, a source of the second thin film transistor NT2 is accessed to the high potential signal VGH, and a drain of the second thin film transistor NT2 is connected to a source of the first thin film transistor NT1.

In the NMOS type GOA circuit provided by the present application, in the first embodiment, the second thin film transistor NT2 is controlled by adding the CK signal (that is, the Nth clock signal CK[N]) to turn on the first thin film transistor NT1 by the Q point potential, when the first thin film transistor NT1 and the second thin film transistor NT2 are turned on, the high potential signal VGH is output as the Nth gate driving signal G[N]. Compared with the CK signal, the high potential signal VGH is the direct current signal, the high potential signal VGH passes through the RC circuit between adjacent cascaded GOA units, the delay condition of the high potential signal VGH is less, so as to ensure the delay condition of the gate driving signals outputted by the upper and lower regions of the NMOS display panel are substantially the same.

Figure 8A:
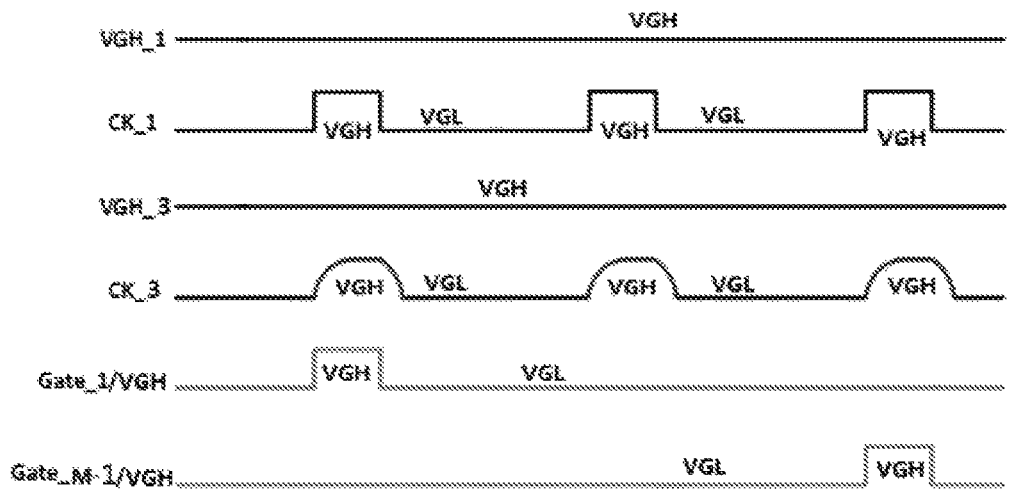
FIG. 8a is a schematic diagram of signal delay of the odd-numbered level GOA units corresponding to the display panel and the output delay of the GOA unit in the first embodiment provided in the present application.
Figure 8B:
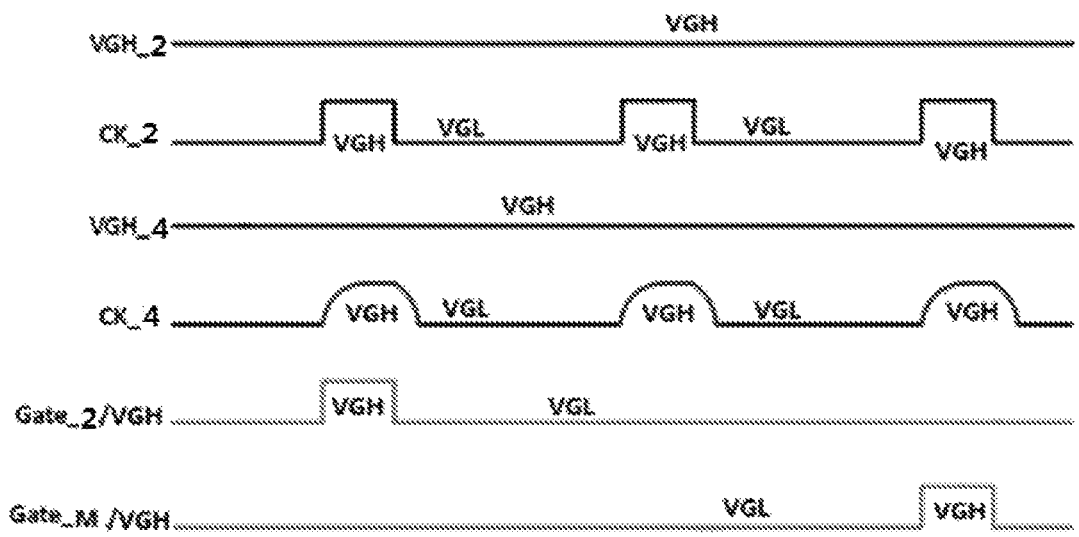
FIG. 8b is a schematic diagram of signal delay of the even-numbered level GOA units corresponding to the display panel and the output delay of the GOA unit in the first embodiment provided in the present application.

As shown in FIG. 8a, FIG. 8a is a schematic diagram of signal delay of the odd-numbered level GOA units corresponding to the display panel and the output delay of the GOA unit in the first embodiment provided in the present application. The gate driving signal Gate_M−1 outputted by the last level GOA unit (the last odd level GOA unit) connected to the first level has no delay with respect to the gate driving signal Gate_1 outputted by the first level GOA unit. As shown in FIG. 8b, FIG. 8b is a schematic diagram of signal delay of the even-numbered level GOA units corresponding to the display panel and the output delay of the GOA unit in the first embodiment provided in the present application. The gate driving signal outputted by the last level GOA unit (the last even level GOA unit) connected to the second level has no delay with respect to the gate driving signal outputted by the second level GOA unit.

Similarly, in the NMOS type GOA circuit provided by the present application, in the second embodiment, the first thin film transistor NT1 can be turned on by the Q-point potential, and the Nth gate driving signal G[N] can be outputted by the Q-point signal. Relative to the CK signal, the Q-point signal is the signal directly generated by each level of GOA unit, and the Q point is further connected to the first voltage stabilizing capacitor C1. Therefore, the Q-point potential is a relatively stable potential when each level of GOA unit is operating with substantially no delay is occurred, so as to ensure that the delay status is substantially the same of the gate driving signals outputted by the upper and lower regions of the NMOS display panel.

Figure 9A:
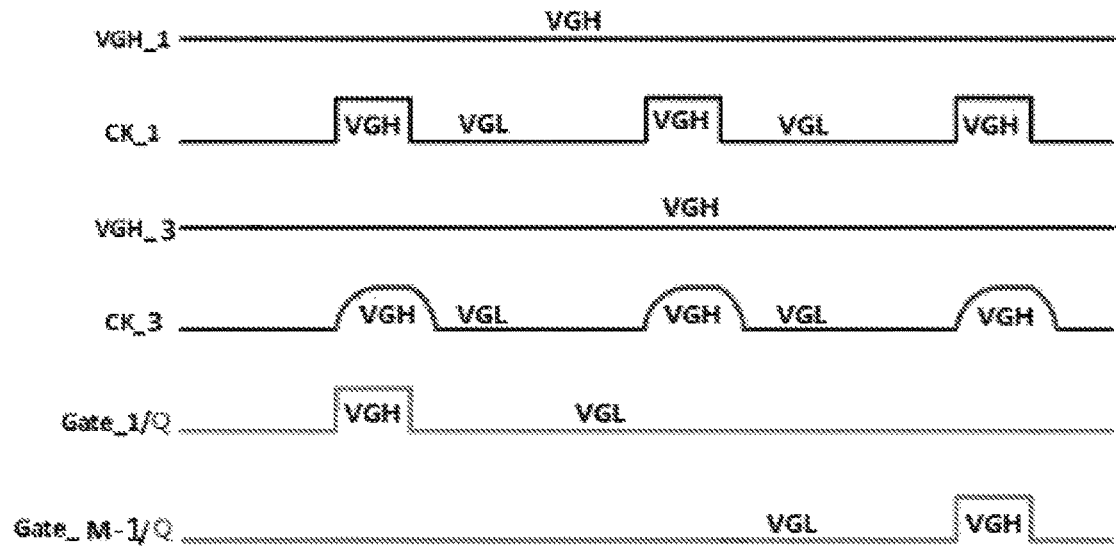
FIG. 9a is a schematic diagram of signal delay of the odd-numbered level GOA units corresponding to the display panel and the output delay of the GOA unit in the second embodiment provided in the present application.
Figure 9B:
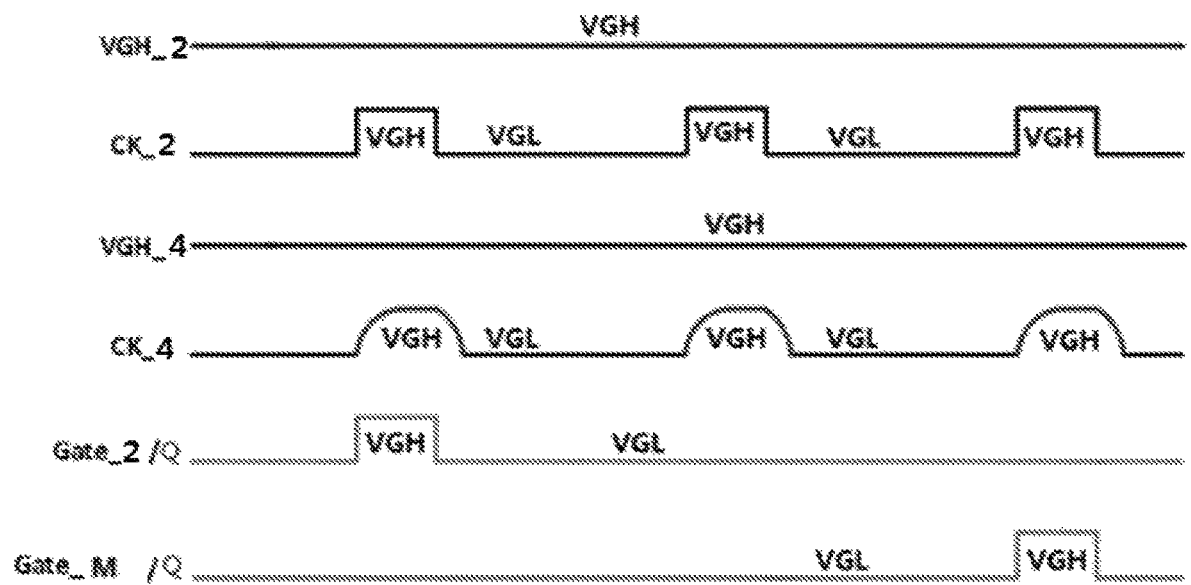
FIG. 9b is a schematic diagram of signal delay of the even-numbered level GOA units corresponding to the display panel and the output delay of the GOA unit in the second embodiment provided in the present application.

As shown in FIG. 9a, FIG. 9a is a schematic diagram of signal delay of the odd-numbered level GOA units corresponding to the display panel and the output delay of the GOA unit in the second embodiment provided in the present application. The gate driving signal Gate_M−1 outputted by the last level GOA unit (the last odd level GOA unit) connected to the first level has no delay with respect to the gate driving signal Gate_1 outputted by the first level GOA unit. Also, as shown in FIG. 9b, FIG. 9b is a schematic diagram of signal delay of the even-numbered level GOA units corresponding to the display panel and the output delay of the GOA unit in the second embodiment provided in the present application. The gate drive signal outputted by the last level GOA unit (the last even level GOA unit) of the second level is also not delayed with respect to the gate drive signal outputted by the second level GOA unit.

Figure 1:
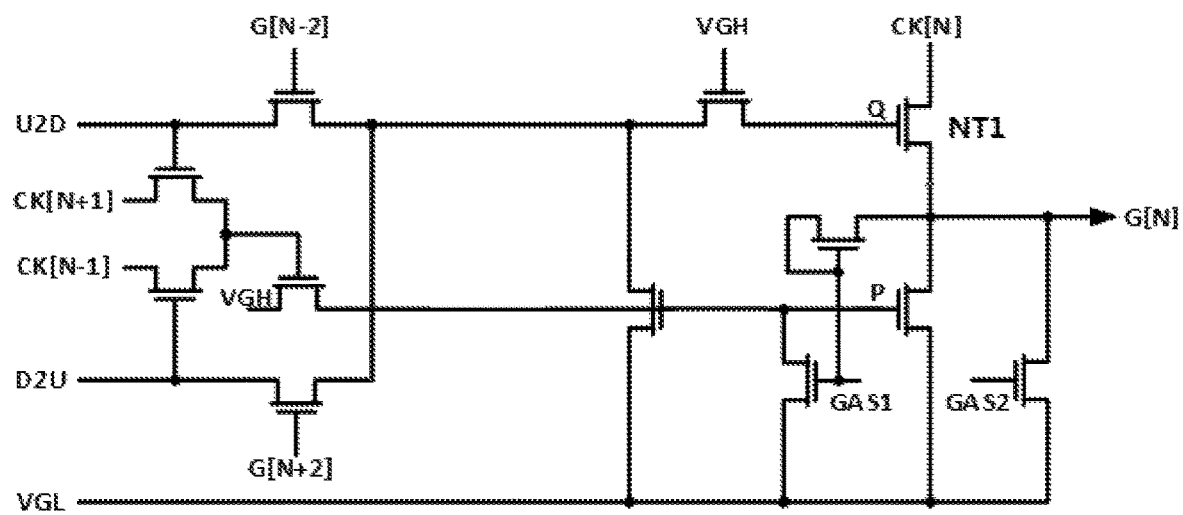
FIG. 1 is a circuit diagram of a GOA unit in the conventional technology provided by the present application.
Figure 2:
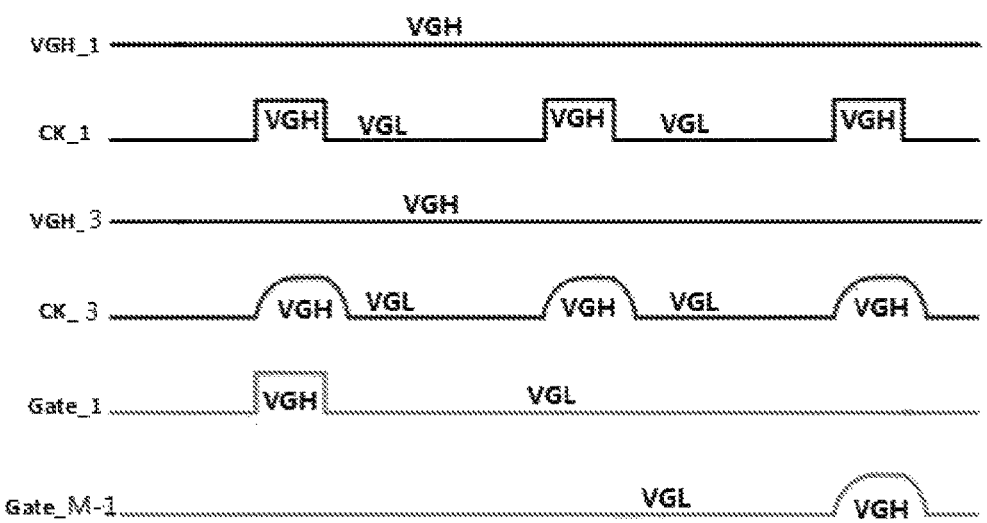
FIG. 2 is a schematic diagram of signal delay based on an NMOS type GOA circuit in the conventional technology and an output delay of the GOA unit in a display panel provided in the present application.
Figure 10A:
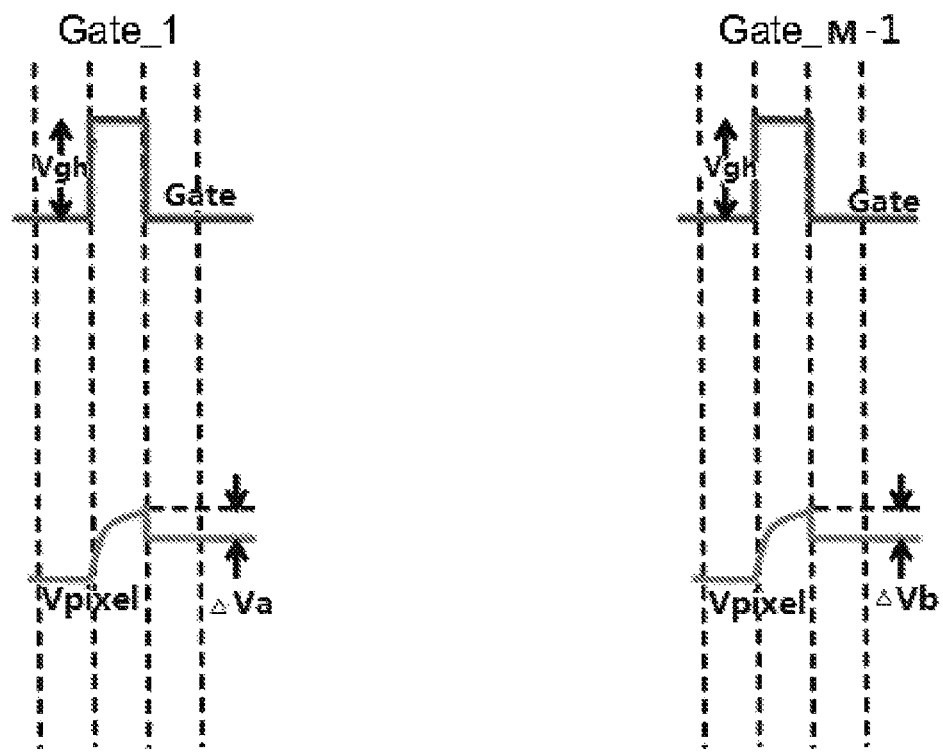
FIG. 10a is a schematic diagram of the feedthrough voltage of the upper and lower regions of the active area AA of the display panel corresponding to the odd-numbered GOA units according to the present application.
Figure 10B:
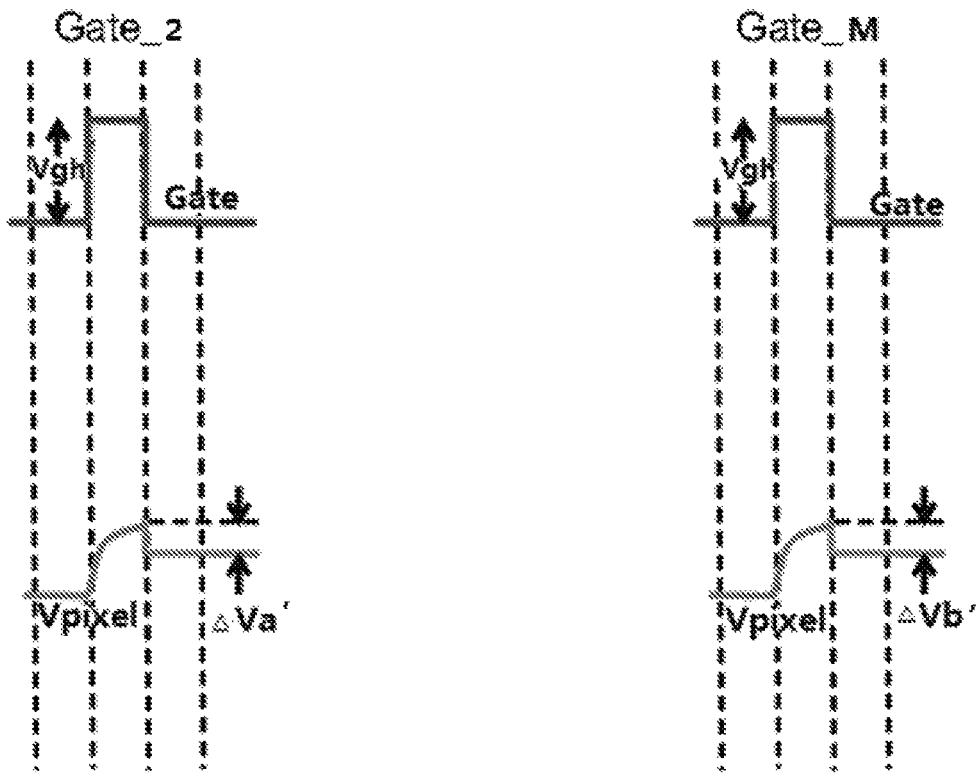
FIG. 10b is a schematic diagram of the feedthrough voltage of the upper and lower regions of the active area AA of the display panel corresponding to the even-numbered GOA units according to the present application.

The delay conditions of the gate driving signals outputted by the upper and lower regions of the NMOS display panel are substantially the same, so as to ensure the consistency of the feedthrough voltages of the upper and lower regions of the NMOS display panel. As shown in FIG. 10a, in the active area AA of the display panel of the NMOS type GOA circuit provided by the present application, the feedthrough voltage ΔVa corresponding to the lower region of the active area AA of the odd-numbered GOA units is substantially equal to the feedthrough voltage ΔVb corresponding to the upper region of the active area AA of the odd-numbered GOA units, the feedthrough voltage Δva' corresponding to the lower region of the active area AA of the even-numbered GOA units is substantially equal to the feedthrough voltage ΔVb' corresponding to the upper region of the active area AA of the even-numbered GOA units, and finally ensure the better uniformity of the flicker of the upper and lower regions of the NMOS display panel. A Vpixel in FIGS. 10a and 1ob is pixel voltages of the upper or lower region of the active area AA.

Figure 11:
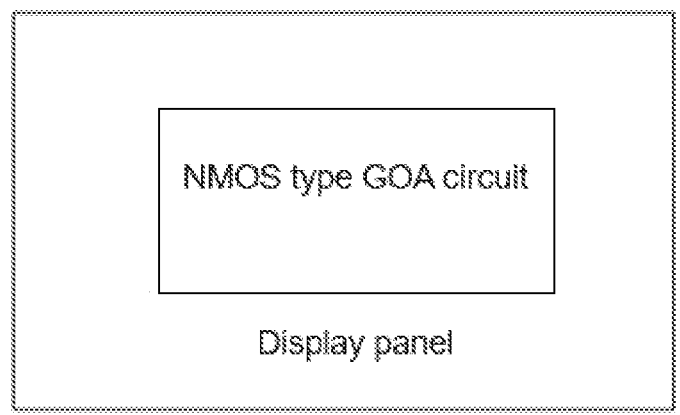
FIG. 11 is a schematic diagram of the display panel provided by the present application.

The present application further provides a display panel, as shown in FIG. 11, the display panel including the above mentioned NMOS type GOA circuit.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. An NMOS type GOA circuit for using in a liquid crystal display panel, comprising: M cascaded GOA units, a Nth level GOA unit comprising: a forward reverse scan control circuit, a node signal control circuit, a node signal output circuit, a pull down circuit, and a output circuit;

the forward reverse scan control circuit configured to control the GOA circuit to perform a forward scan or a reverse scan according to a forward scan control signal or a reverse scan control signal;

the output circuit comprising a first thin film transistor and a second thin film transistor, the node signal output circuit comprising a third thin film transistor, and the pull-down circuit comprising a fourth thin film transistor;

a first terminal of the second thin film transistor accessed to a high voltage signal or connected to a third terminal of the first thin film transistor, a second terminal of the second thin film transistor connected to a first terminal of the first thin film transistor, and a third terminal of the second thin film transistor accessed to a Nth clock signal;

the third terminal of the first thin film transistor connected to an output terminal of the forward reverse scan control circuit and accessed to a low potential signal by a first voltage stabilizing capacitor, a second terminal of the first thin film transistor connected to a first terminal of the fourth thin film transistor and as an output terminal of the Nth gate driving signal, and a second terminal of the fourth thin film transistor accessed to the low potential signal;

the node signal control circuit connected to a third terminal of the third thin film transistor and configured to output a clock signal to the third thin film transistor for controlling the third thin film transistor to be turned on and turned off;

a first terminal of the third thin film transistor connected to a high potential signal, and a second terminal of the third thin film transistor connected to a third terminal of the fourth thin film transistor;

wherein M≥N≥1, the high potential signal is a direct current signal, the first terminal of the thin film transistor is one of a source and a drain, the second terminal is the other of the source and the drain, and the third terminal is a gate;

wherein the GOA unit further comprises a pull-up circuit; the pull-up circuit comprises an eighth thin film transistor and a ninth thin film transistor, the pull-down circuit further comprises a tenth thin film transistor;

a first terminal of the eighth thin film transistor is connected to the third terminal of the fourth thin film transistor, a second terminal and a third terminal of the eighth thin film transistor are respectively accessed to the low potential signal and a first global control signal;

a first terminal and a third terminal of the ninth thin film transistor are both accessed to a first global control signal, and a second terminal is connected to the second terminal of the first thin film transistor; and a first terminal of the tenth thin film transistor is connected to the second terminal of the first thin film transistor, a second terminal and a third terminal of the tenth thin film transistor are respectively accessed to the low potential signal and a second global control signal.

2. The NMOS type GOA circuit according to claim 1, wherein the forward and reverse scan control circuit comprises a fifth thin film transistor and a sixth thin film transistor, the GOA unit further comprises a seventh thin film transistor;

a first terminal and a third terminal of the fifth thin film transistor are respectively accessed to the forward scanning control signal and a N−2th gate driving signal, and a second terminal is connected to a first terminal of the seventh thin film transistor;

a third terminal of the seventh thin film transistor is connected to the high potential signal, a second terminal of the seventh thin film transistor is connected to the third terminal of the first thin film transistor; and a first terminal and a third terminal of the sixth thin film transistor are respectively accessed to the reverse scan control signal and a N+2th gate driving signal, and a second terminal is connected to the second terminal of the fifth thin film transistor.

3. The NMOS type GOA circuit according to claim 1, wherein the node signal control circuit comprises an eleventh thin film transistor and a twelfth thin film transistor; and a first terminal of the eleventh thin film transistor and a first terminal of the twelfth thin film transistor are respectively accessed to a N+1th clock signal and a N−1th clock signal, a second terminal of the eleventh thin film transistor is connected to a second terminal of the twelfth thin film transistor and the third terminal of the third thin film transistor, a third terminal of the eleventh thin film transistor and a third terminal of the twelfth thin film transistor are accessed to the forward scan control signal and the reverse scan control signal, respectively.

4. The NMOS type GOA circuit according to claim 1, wherein the GOA unit further comprises a reset circuit, the reset circuit comprises a thirteenth thin film transistor, a first terminal of the thirteenth thin film transistor is connected to the third terminal of the fourth thin film transistor, a second terminal of the thirteenth thin film transistor is connected to a third terminal of the thirteenth thin film transistor and is accessed to the reset signal.

5. The NMOS type GOA circuit according to claim 2, wherein the GOA unit further comprises a fourteenth thin film transistor and a fifteenth thin film transistor;

a first terminal and a third terminal of the fourteenth thin film transistor are respectively connected to the first terminal of the seventh thin film transistor and the second terminal of the third thin film transistor, a second terminal of the fourteenth thin film transistor is accessed to the low potential signal; and a first terminal and a third terminal of the fifteenth thin film transistor are respectively connected to the third terminal of the fourth thin film transistor and the second terminal of the sixth thin film transistor, a second terminal of the fifteenth thin film transistor is accessed to the low potential signal.

6. The NMOS type GOA circuit according to claim 1, wherein the GOA unit further comprises a second voltage stabilizing capacitor; and two terminals of the second voltage stabilizing capacitor are respectively connected to the first terminal and the second terminal of the eighth thin film transistor.

7. The NMOS type GOA circuit according to claim 1, wherein RC circuits are connected in series between adjacent odd-numbered level GOA units and adjacent even-numbered level GOA units.

8. The NMOS type GOA circuit according to claim 1, wherein a source of the second thin film transistor is accessed to the high potential signal, and a drain of the second thin film transistor is connected to a source of the first thin film transistor.

9. An NMOS type GOA circuit for using in a liquid crystal display panel, comprising: M cascaded GOA units, a Nth level GOA unit comprising: a forward reverse scan control circuit, a node signal control circuit, a node signal output circuit, a pull down circuit, and a output circuit;

the forward reverse scan control circuit configured to control the GOA circuit to perform a forward scan or a reverse scan according to a forward scan control signal or a reverse scan control signal;

the output circuit comprising a first thin film transistor and a second thin film transistor, the node signal output circuit comprising a third thin film transistor, and the pull-down circuit comprising a fourth thin film transistor;

a first terminal of the second thin film transistor accessed to a high voltage signal or connected to a third terminal of the first thin film transistor, a second terminal of the second thin film transistor connected to a first terminal of the first thin film transistor, and a third terminal of the second thin film transistor accessed to a Nth clock signal;

the third terminal of the first thin film transistor connected to an output terminal of the forward reverse scan control circuit and accessed to a low potential signal by a first voltage stabilizing capacitor, a second terminal of the first thin film transistor connected to a first terminal of the fourth thin film transistor and as an output terminal of the Nth gate driving signal, and a second terminal of the fourth thin film transistor accessed to the low potential signal;

the node signal control circuit connected to a third terminal of the third thin film transistor and configured to output a clock signal to the third thin film transistor for controlling the third thin film transistor to be turned on and turned off;
a first terminal of the third thin film transistor connected to a high potential signal, and a second terminal of the third thin film transistor connected to a third terminal of the fourth thin film transistor;
wherein the forward and reverse scan control circuit comprises a fifth thin film transistor and a sixth thin film transistor, the GOA unit further comprises a seventh thin film transistor;
a first terminal and a third terminal of the fifth thin film transistor are respectively accessed to the forward scanning control signal and a N−2th gate driving signal, and a second terminal is connected to a first terminal of the seventh thin film transistor;
a third terminal of the seventh thin film transistor is connected to the high potential signal, a second terminal of the seventh thin film transistor is connected to the third terminal of the first thin film transistor; and
a first terminal and a third terminal of the sixth thin film transistor are respectively accessed to the reverse scan control signal and a N+2th gate driving signal, and a second terminal is connected to the second terminal of the fifth thin film transistor; and
wherein M≥N≥1, the high potential signal is a direct current signal, the first terminal of the thin film transistor is one of a source and a drain, the second terminal is the other of the source and the drain, and the third terminal is a gate;
wherein the GOA unit further comprises a pull-up circuit;
the pull-up circuit comprises an eighth thin film transistor and a ninth thin film transistor, the pull-down circuit further comprises a tenth thin film transistor;
a first terminal of the eighth thin film transistor is connected to the third terminal of the fourth thin film transistor, a second terminal and a third terminal of the eighth thin film transistor are respectively accessed to the low potential signal and a first global control signal;
a first terminal and a third terminal of the ninth thin film transistor are both accessed to a first global control signal, and a second terminal is connected to the second terminal of the first thin film transistor; and
a first terminal of the tenth thin film transistor is connected to the second terminal of the first thin film transistor, a second terminal and a third terminal of the tenth thin film transistor are respectively accessed to the low potential signal and a second global control signal.

10. The NMOS type GOA circuit according to claim 9, wherein the node signal control circuit comprises an eleventh thin film transistor and a twelfth thin film transistor; and
a first terminal of the eleventh thin film transistor and a first terminal of the twelfth thin film transistor are respectively accessed to a N+1th clock signal and a N−1th clock signal, a second terminal of the eleventh thin film transistor is connected to a second terminal of the twelfth thin film transistor and the third terminal of the third thin film transistor, a third terminal of the eleventh thin film transistor and a third terminal of the twelfth thin film transistor are accessed to the forward scan control signal and the reverse scan control signal, respectively.

11. The NMOS type GOA circuit according to claim 9, wherein the GOA unit further comprises a reset circuit, the reset circuit comprises a thirteenth thin film transistor, a first terminal of the thirteenth thin film transistor is connected to the third terminal of the fourth thin film transistor, a second terminal of the thirteenth thin film transistor is connected to a third terminal of the thirteenth thin film transistor and is accessed to the reset signal.

12. The NMOS type GOA circuit according to claim 9, wherein the GOA unit further comprises a fourteenth thin film transistor and a fifteenth thin film transistor;
a first terminal and a third terminal of the fourteenth thin film transistor are respectively connected to the first terminal of the seventh thin film transistor and the second terminal of the third thin film transistor, a second terminal of the fourteenth thin film transistor is accessed to the low potential signal; and
a first terminal and a third terminal of the fifteenth thin film transistor are respectively connected to the third terminal of the fourth thin film transistor and the second terminal of the sixth thin film transistor, a second terminal of the fifteenth thin film transistor is accessed to the low potential signal.

13. The NMOS type GOA circuit according to claim 9, wherein the GOA unit further comprises a second voltage stabilizing capacitor; and
two terminals of the second voltage stabilizing capacitor are respectively connected to the first terminal and the second terminal of the eighth thin film transistor.

14. The NMOS type GOA circuit according to claim 9, wherein RC circuits are connected in series between adjacent odd-numbered level GOA units and adjacent even-numbered level GOA units.

15. The NMOS type GOA circuit according to claim 9, wherein a source of the second thin film transistor is accessed to the high potential signal, and a drain of the second thin film transistor is connected to a source of the first thin film transistor.

16. A display panel, comprising an NMOS type GOA circuit for using in a liquid crystal display panel, comprising: M cascaded GOA units, a Nth level GOA unit comprising: a forward reverse scan control circuit, a node signal control circuit, a node signal output circuit, a pull down circuit, and a output circuit;
the forward reverse scan control circuit configured to control the GOA circuit to perform a forward scan or a reverse scan according to a forward scan control signal or a reverse scan control signal;
the output circuit comprising a first thin film transistor and a second thin film transistor, the node signal output circuit comprising a third thin film transistor, and the pull-down circuit comprising a fourth thin film transistor;
a first terminal of the second thin film transistor accessed to a high voltage signal or connected to a third terminal of the first thin film transistor, a second terminal of the second thin film transistor connected to a first terminal of the first thin film transistor, and a third terminal of the second thin film transistor accessed to a Nth clock signal;
the third terminal of the first thin film transistor connected to an output terminal of the forward reverse scan control circuit and accessed to a low potential signal by a first voltage stabilizing capacitor, a second terminal of the first thin film transistor connected to a first terminal of the fourth thin film transistor and as an output terminal of the Nth gate driving signal, and a second terminal of the fourth thin film transistor accessed to the low potential signal;
the node signal control circuit connected to a third terminal of the third thin film transistor and configured to output a clock signal to the third thin film transistor for controlling the third thin film transistor to be turned on and turned off;

a first terminal of the third thin film transistor connected to a high potential signal, and a second terminal of the third thin film transistor connected to a third terminal of the fourth thin film transistor;

wherein M≥N≥1, the high potential signal is a direct current signal, the first terminal of the thin film transistor is one of a source and a drain, the second terminal is the other of the source and the drain, and the third terminal is a gate;

wherein the GOA unit further comprises a pull-up circuit; the pull-up circuit comprises an eighth thin film transistor and a ninth thin film transistor, the pull-down circuit further comprises a tenth thin film transistor;

a first terminal of the eighth thin film transistor is connected to the third terminal of the fourth thin film transistor, a second terminal and a third terminal of the eighth thin film transistor are respectively accessed to the low potential signal and a first global control signal;

a first terminal and a third terminal of the ninth thin film transistor are both accessed to a first global control signal, and a second terminal is connected to the second terminal of the first thin film transistor; and a first terminal of the tenth thin film transistor is connected to the second terminal of the first thin film transistor, a second terminal and a third terminal of the tenth thin film transistor are respectively accessed to the low potential signal and a second global control signal.

17. The display panel according to claim 16, wherein the forward and reverse scan control circuit comprises a fifth thin film transistor and a sixth thin film transistor, the GOA unit further comprises a seventh thin film transistor;

a first terminal and a third terminal of the fifth thin film transistor are respectively accessed to the forward scanning control signal and a N−2th gate driving signal, and a second terminal is connected to a first terminal of the seventh thin film transistor;

a third terminal of the seventh thin film transistor is connected to the high potential signal, a second terminal of the seventh thin film transistor is connected to the third terminal of the first thin film transistor; and a first terminal and a third terminal of the sixth thin film transistor are respectively accessed to the reverse scan control signal and a N+2th gate driving signal, and a second terminal is connected to the second terminal of the fifth thin film transistor.

* * * * *